United States Patent [19]

Sites

[11] 4,251,853
[45] Feb. 17, 1981

[54] ANNUNCIATOR OF MODULAR CONSTRUCTION

[75] Inventor: George A. Sites, West Jefferson, Ohio

[73] Assignee: Halmar Electronics, Inc., Columbus, Ohio

[21] Appl. No.: 21,882

[22] Filed: Mar. 19, 1979

[51] Int. Cl.$^3$ .............................................. H05K 7/10
[52] U.S. Cl. ................................... 361/394; 361/393; 361/395; 361/415
[58] Field of Search ............... 361/393, 394, 395, 399, 361/415

[56] References Cited

U.S. PATENT DOCUMENTS

| | | | |
|---|---|---|---|
| 3,201,786 | 8/1965 | Andersen | 361/394 X |
| 3,309,577 | 3/1967 | Roll | 361/393 |
| 3,316,460 | 4/1967 | Scoville | 361/415 |
| 3,375,408 | 3/1968 | Buhrendorf | 361/394 X |
| 3,573,558 | 4/1971 | Babcock | 361/405 X |
| 4,001,797 | 1/1977 | Buss | 361/394 X |
| 4,004,194 | 1/1977 | Doerflinger | 361/415 X |

FOREIGN PATENT DOCUMENTS 2748100  3/1979  Fed. Rep. of Germany .......... 361/415
1392649  2/1964  France .................................. 361/415

Primary Examiner—Richard R. Kucia
Attorney, Agent, or Firm—Wood, Heron & Evans

[57] ABSTRACT

The annunciator is formed of a plurality of square cross-section modules. Each module includes a plastic housing, a mother board mounted on one end of said housing, one or more point cards slidably mounted in the housing and a light card mounted in the housing. The light card carries a light reflector which is covered by a bezel having removable lenses. The light reflector is adapted to be modified to accommodate one, two, three or four signal lights. The point or light cards are plugged into the mother card. The mother card also carries a power supply mounted on a card. A terminal board is mounted on the power supply card. The rear portion of an assembly of modules is enclosed by a shroud formed of a plurality of foraminous metal plates. The multiple modules are joined together by mating pins and sockets with an assembly being tied together by a frame around the front end of the assembly.

14 Claims, 6 Drawing Figures

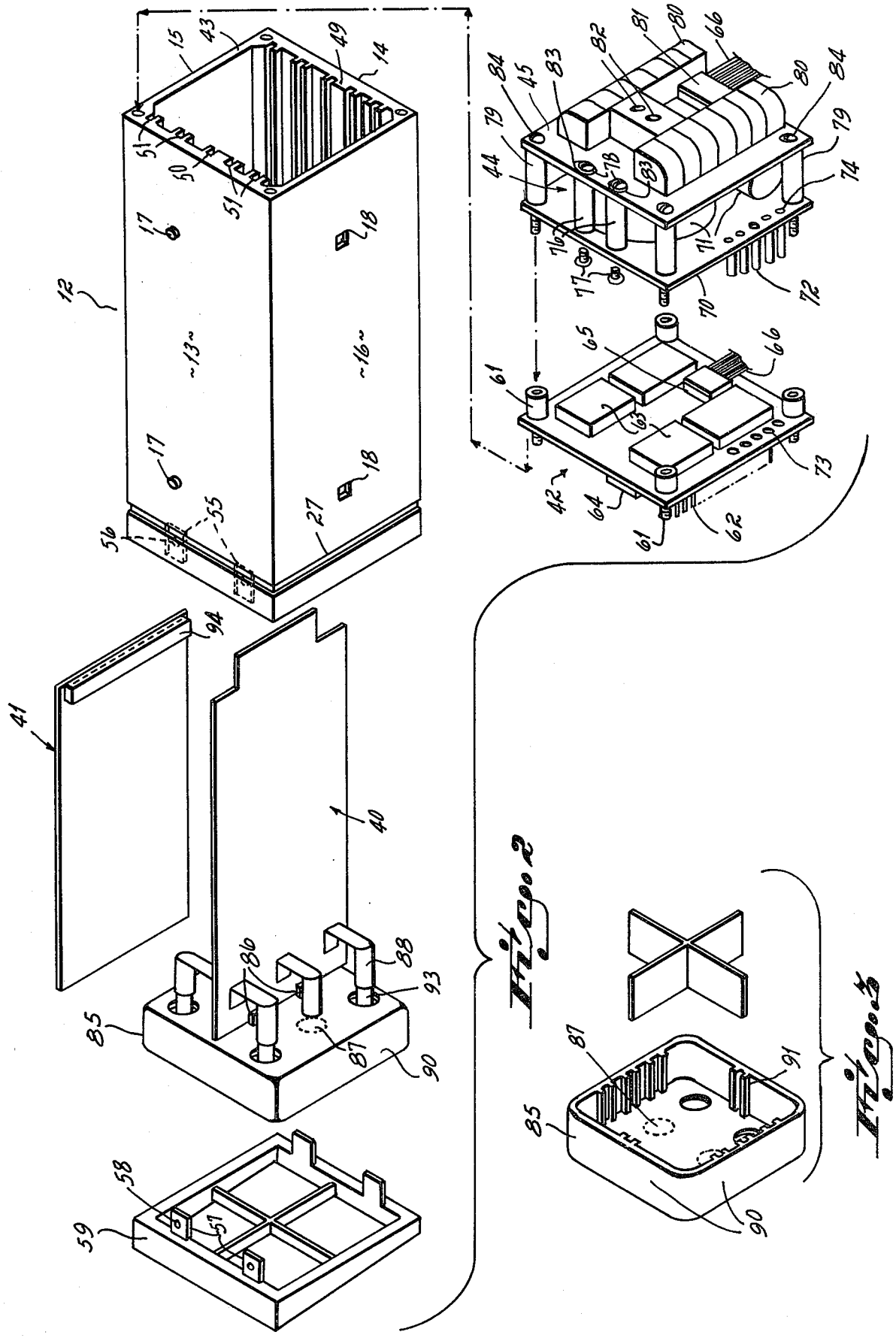

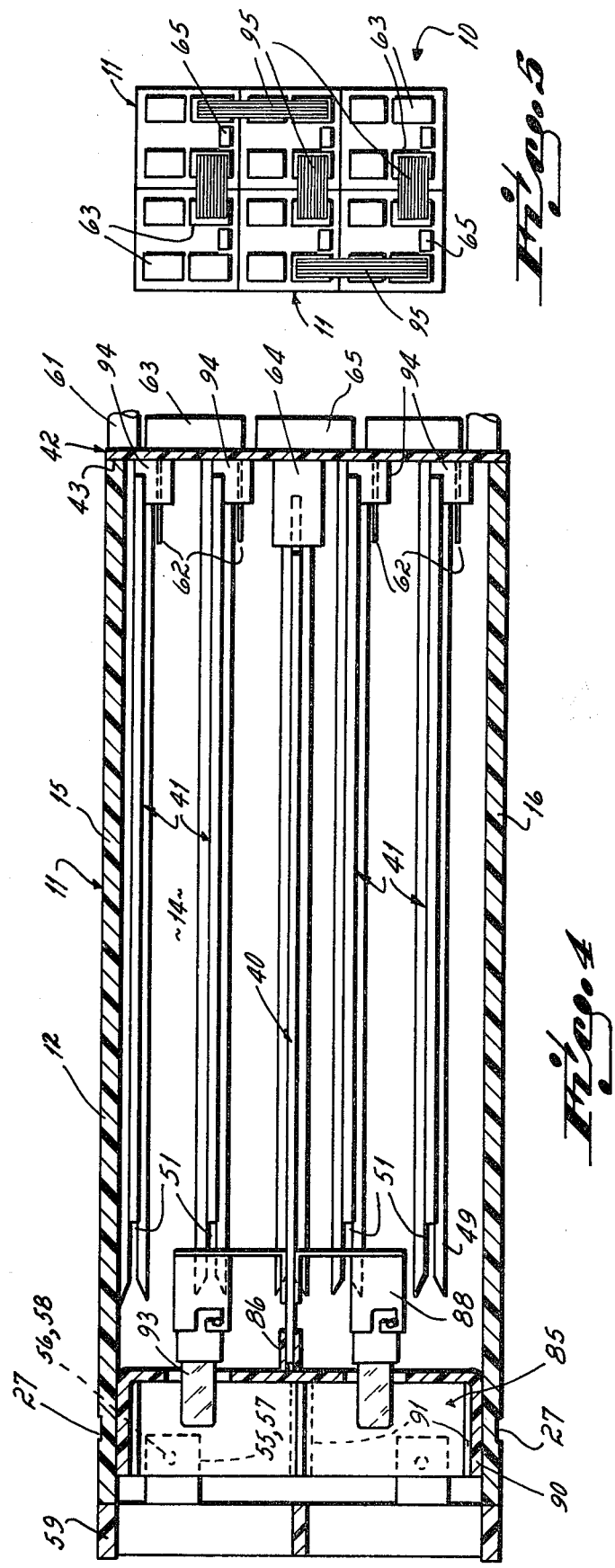

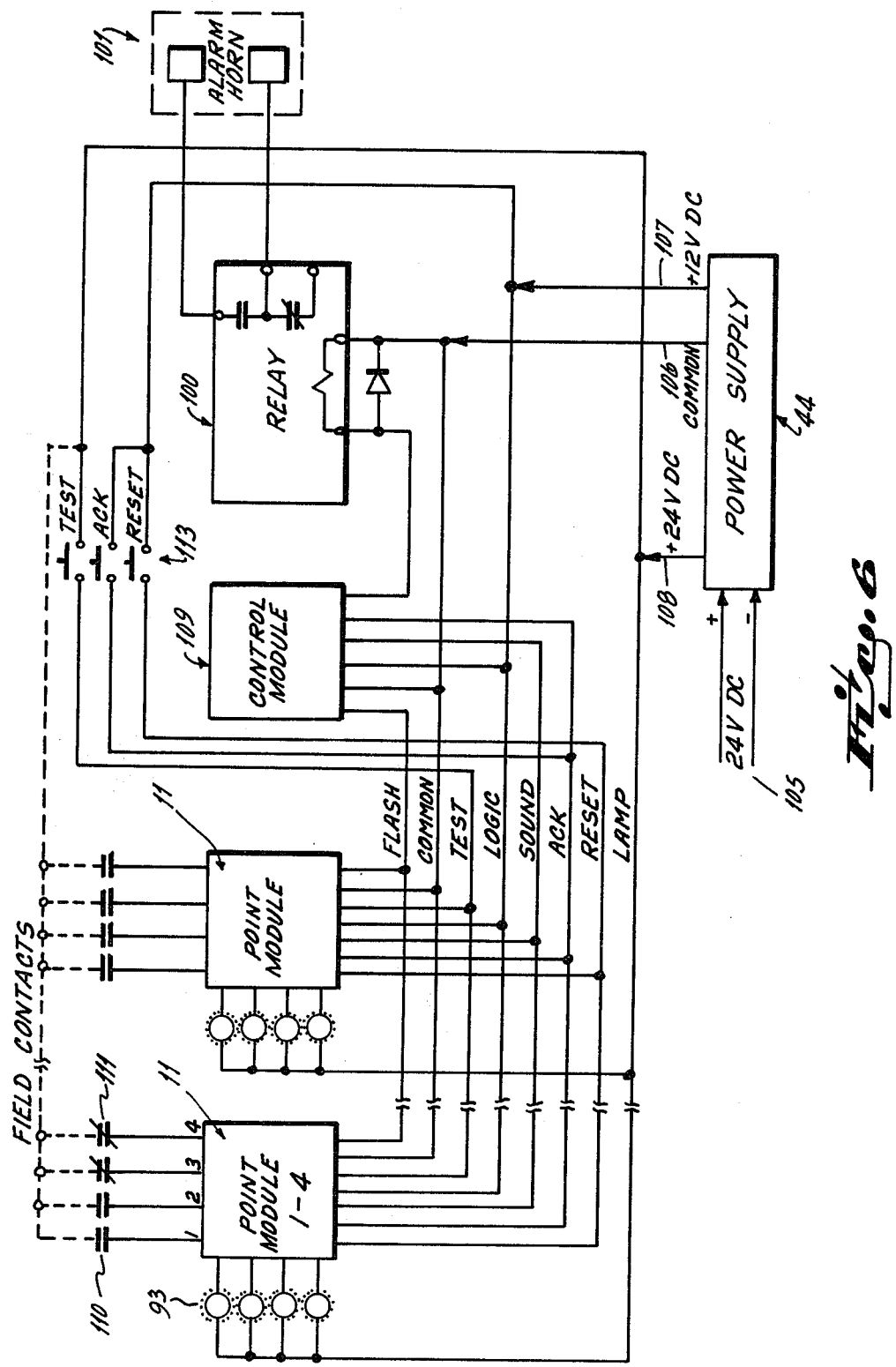

ANNUNCIATOR OF MODULAR CONSTRUCTION

This invention relates to an annunciator, and more particularly, the invention relates to an annunciator of modular construction.

An annunciator is a device for monitoring conditions remote from a central location. It includes a display having a light illuminated lens associated with each point being monitored. A sensor located at the point to be monitored is electrically connected to the annunciator, and particularly to the specific display position with which it is associated. If the condition at the point being monitored changes, e.g., a fault occurs, a light is energized at the lens associated with the point being monitored.

The annunciator has a central control which may have several functions. For example, it can cause a horn to be energized when any of the points being monitored produces an alarm signal. It can provide for the simultaneous testing of all of the individual control systems for the individual points being monitored. It can be used to change the condition of the energized light bulb as, for example, from a flashing alarm state to a steady state. It can provide a control for resetting the system after the fault has been cleared at the point being monitored.

Annunciators are used in every conceivable situation where conditions located at multiple points are to be monitored and include, for example, petroleum and other continuous refining processes, substations and control stations in electrical distribution systems, diverse locations on compressors and pumps, security systems, etc. The variety of applications for which annunciators are employed is almost endless. Because of the wide variety of applications, and because of the different sizes of organizations using the annunciators, it is necessary that the annunciators be custom built for almost every customer. One customer might have 12 points being monitored and another customer might have 200 points being monitored. Because of the requirement for custom tailoring of the annunciator to the customer's requirements, it has been necessary to specially fabricate the casing within which the annunciator is contained and to hand wire many of the internal components of the annunciator so as to suit the customer's requirements.

While some effort has been made to minimize the problems associated with custom building of annunciators through modular construction, the commercial practices to date have left much to be desired in carrying forward the concept of using standard components capable of being assembled in such a way as to accommodate all of the customers' requirements and in the elimination of all hand wiring.

An objective of the present invention has been to provide an annunciator which may be built entirely of standard components and which requires no special fabrication of components to adapt it to a customer's requirements. The annunciator of the present invention has as a basic component a module which comprises a housing carrying all of the electrical components for the monitoring of 1 to 4 points. The modules may be assembled together in any numbers, depending upon the requirements of the customer, and in any patterns. For example, if a customer's requirements call for twelve modules, they may be assembled in a $1 \times 12$, $2 \times 6$ or $3 \times 4$ pattern.

No hand wiring is required to assemble a complete annunciator ready for connection to the customer's monitoring terminals.

The annunciator has the capability of being expanded up to four times the points being monitored without any expansion of the physical dimensions of the annunciator. For example, if the customer has 12 points to be monitored and uses a 12 module assembly, each module being equipped to monitor a single point, that annunciator can be expanded to monitor 48 points without increasing its overall physical dimensions.

The annunciator embodies a number of features which interact to provide the primary objectives set forth above. To understand the significance of those features, the following terms with their definitions will be used:

A point card is a printed circuit containing the logic required to operate the single light associated with a single point being monitored.

A control card is a printed circuit containing the logic to perform functions common to all of the points in the annunciator.

A light card is a printed circuit card which, in the preferred form of the invention, carries six light bulb sockets and a reflector with which the light bulbs are associated.

A mother card is a printed circuit card, printed on both sides, which is mounted on the end of the module for each housing. On its front face it carries connectors for making electrical connection to any of four point cards and a connector for making electrical connection to a light card.

Included among the several features of the invention are the following:

A plastic housing for each module is hollow and has a square cross-section. Two opposing surfaces are formed with square pegs and square holes, respectively, and the remaining two opposing surfaces are formed with round pegs and holes, respectively. The pegs of one module fit into the similar holes of the adjoining module to build up an assembly of multiple modules all of which are connected together, in the first instance, by the pegs in the holes. The different configurations of pegs in holes provide assurance that the modules, when assembled into an annunciator, will all be of the same orientation.

Internally the casing has, on its upper and lower surfaces, ribs forming five slots adapted to receive printed circuit cards. The central opposed slots receive a light or combined light and control card, and the outboard four opposed slots receive point cards. The end portions of the point and light cards are adapted to engage mating connectors on a mother card mounted on the end of the housing. The slots are positioned with respect to the mother card and the respective connectors in such a way that the point cards can only be mounted in the correct orientation and still properly engage the connector on the mother card. Thus, inadvertent reversal of the orientation card is prohibited with consequent avoiding of shorting out and ruining the components on the cards.

The light card carries the reflector with the plane of the light card being slightly offset from the center line of the reflector. The central opposed slots in the housing which receive the light card are slightly offset from the center of the housing as is the connector mounted on the mother board. If the light card is properly oriented when it is put in its slot, the reflector will seat snugly in the interior of the housing. If the position of the light card is reversed, however, the offset of the reflector will prevent its being seated properly in the interior of the housing. Thus, the light card can only be inserted in the housing and connected to the mother card when it is properly oriented.

The housing also has means for snap-in mounting of a lens-containing bezel at the front end of the housing. One of four different styles of bezels, each having snap-in lenses, is provided so as to adapt each module for displaying one, two, three or four points.

Utilizing the elements thus far described, it can be seen that each module is adapted to accommodate one to four points by the simple expedient of (a) inserting the desired number of point cards in the module;

(b) inserting the desired number of light bulbs on the light card; and (c) snapping in the appropriate bezel.

Each module can be equipped to monitor a selected number of points at the time of original installation, and it can be expanded in the field for monitoring additional points within a matter of minutes simply by inserting additional point cards, light bulbs and changing the bezel.

The reflector has six knockouts through which light bulbs may be inserted. The reflector also has on its internal walls a number of the divider-receiving slots which enables each reflector to be divided into halves, thirds or quarters depending upon the number of points being monitored through a single module.

A power supply is mounted on each module. This is contrasted to the normal practice of providing a single power supply for the complete annunciator. Among the advantages of using a power supply for each module are the avoiding of the shutdown of the whole annunciator in the event of the failure of the power supply and the avoiding of exceeding the capacity of the power supply in the event that the points being monitored are greatly expanded over the original installation.

The power supply is conveniently mounted on the mother card and connected to the mother card by five pins passing through aligned pin-receiving sockets on the mother card and power supply card, respectively. Thus, no hand wiring is required to connect the power supply to the module.

A terminal board is mounted adjacent the power supply and is connected to the mother board by a flat cable having plug-in connectors on each end. Thus, no hand wiring is required to connect the logic within the modules to the terminal board.

Each annunciator includes one combined control card and light card. By combining the control card and light card, the control card does not utilize any extra positions in the annunciator.

An assembly of a number of modules is enclosed at its front end by a frame consisting of identical extrusions connected at the corners by specially designed corner elements interfitting with the extrusions. The corner members are provided with set screws which engage the extrusions and when driven tightly against the extrusions tend to draw the extrusions into tight engagement with the corner members. The combination of the interconnection of housing to housing through the holes and pegs and the frame around the assembly provides a very secure annunciator assembly suitable for mounting on a panel. The extrusion is provided with a special slot for receiving a connector by which the annunciator is secured to a panel.

At the rear end of the assembly, a shroud is provided, the shroud consisting of a plurality of foraminous plates of two different kinds. One kind of plate is L-shaped for forming the corners of the shroud and the other plates are generally flat with offsets on their ends for forming straight sections of the shroud. By using the prefabricated plates, there is no requirement for custom metal forming operations to fabricate a shroud suitable for a particular customer's requirements.

Still another feature of the invention resides in the providing for isolating each light from the logic on the point cards so that in the event of a short within the light or its socket, no damage will occur to the point card circuitry.

The several objectives and features of the invention will become more readily apparent from the following detailed description taken in conjunction with the accompanying drawings in which:

FIG. 2 is a disassembled perspective view of a module of the present invention;

FIG. 3 is a perspective view of a reflector used with each module;

FIG. 4 is a cross-sectional view taken along lines 4—4 of FIG. 1;

FIG. 5 is a diagrammatic end view of an annunciator showing the electrical interconnection of adjacent modules; and FIG. 6 is a block circuit diagram of the annunciator system.

GENERAL ORGANIZATION

Figure 1:
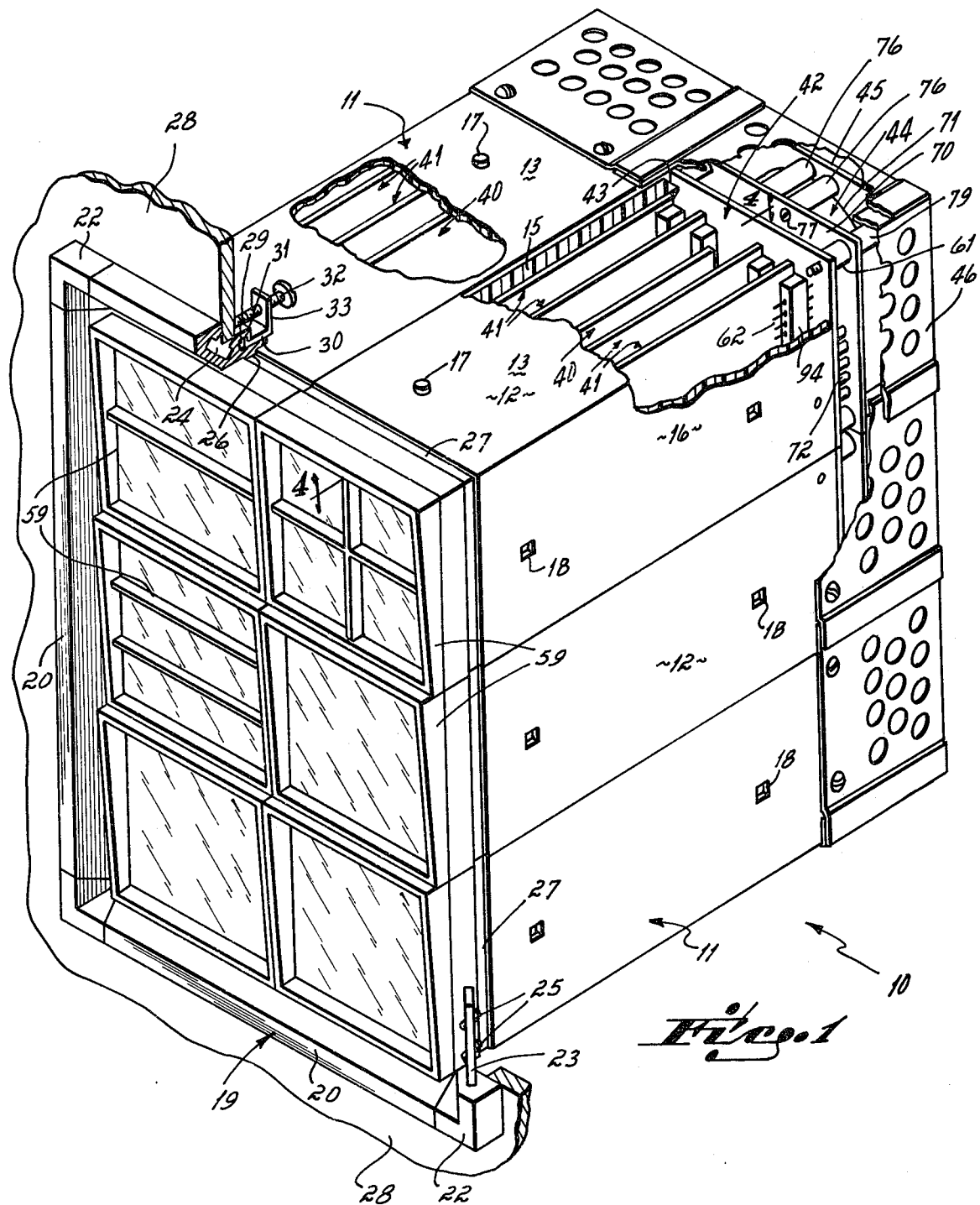
FIG. 1 is a perspective view of an annunciator of the present invention.

An annunciator according to the present invention is shown at 10 in FIG. 1 and, for illustrative purposes, includes a 2×3 assemblage of six modules. Each module 11 (also shown in FIG. 2.) has its own housing 12. Each housing has an upper wall 13 and a lower wall 14, a left side wall 15 and a right side wall 16. The upper wall 13 has two upwardly projecting round pins 17 which are offset about ⅛ inch from the center line, and the lower wall 14 has two mating round holes (not shown) similarly offset. Vertically adjacent modules are interconnected by the engagement of the pins of one module with the holes of the adjacent module.

The left wall 15 has projecting square pegs (not shown) adjacent the center line and the right-hand wall 16 has adjacent mating square holes 8 adjacent the center line. Horizontally adjacent modules are interconnected by the inserting of the pegs in the mating square holes 18. Because of the difference in the minimal offset from the center line of the square pegs and holes, and as contrasted to the greater offset of the round pins and holes, it is impossible to assemble modules with an improper orientation without creating an easily perceived misalignment.

A frame 19 surrounds the assembly of modules. The frame 19 consists of upper and lower and two side extrusions 20 of identical cross section, the extrusions being interconnected by four corner blocks 22. Each corner block 22 has projecting keys 23 which extend into a groove 24 in the extrusion. The keys have set screws 25 to secure the keys against the extrusions thereby fixing the corner blocks into position with respect to the extrusions 20. The set screws are at an angle of about 75° to the plane of the keys so that when tightened against the extrusion, the set screws pull the corner blocks 22 tightly against the ends of the extrusion 20 thereby making neat, tight-fitting corners.

The extrusion 20 has a rib 26 which fits in a groove 27 around the front edge of each module. The combination of the interfitting pegs, pins and holes and the snugly-fitting frame lodged in the groove 27 binds the modules together in a package able to withstand very substantial rough handling and vibration without any tendency to become disassembled.

The extrusion has a second groove 29 which permits the annunciator to be mounted in a panel 28 by means of a J clip which has a hooked leg 30 which slides into the groove 29 and hooks under an overhang 31. A screw 32 in a leg 33 of the J clip bears against panel 28 to clamp the extrusion 20 and frame 19 against the panel. As many of the J clips as is necessary to support the annunciator may be applied.

Each module 11 includes, within the hollow interior of the housing 12, one light card or combined light and control card 40 and one to four point cards 41. In FIG. 1 the upper right-hand module is provided with four point cards for monitoring four points while the upper left-hand module is provided with two point cards for monitoring two points. The light card 40 and point cards 41 are connected to connectors on the front surface of a mother card 42 which is secured to the rear end 43 of the housing 12. A power supply 44 is mounted on a card which is in turn secured to the rear side of the mother card 42. A terminal board 45 is secured to the rear side of the power supply board. These components which project from the rear end 43 of each housing are enclosed by a shroud 46. All of the components are assembled and interconnected without any need for hand wiring. The only hand wiring applied to the annunciator is that associated with connecting the terminal board to the external circuits which in turn are connected to the monitoring sensors.

THE HOUSING

Some of the features of the housing 12 have already been described above in connection with the general assembly. Within the interior of each housing are longitudinal slots formed by ribs 49 on the upper and lower internal surfaces of the housing. These include a central pair of opposed slots 50 and a pair of opposed outboard slots 51 on each side of the center slots. The center slots 50 receive the light card 40 and the outboard slots 51 receive one or more point cards 41. It can be seen from FIGS. 2 and 4 that the slots 50 and 51 are not perfectly symmetrical about a longitudinal center line. The center slot 50 is offset slightly and the outboard slots are likewise offset slightly so as to create an interference or a failure to properly engage connectors on the mother board when the cards are inserted in their respective slots in an improper orientation. This will become more apparent from the description of the respective cards and the connectors on the mother board below.

The casing also has two recesses 55 in the front edges of the upper and lower surfaces for mounting a bezel 59. Each of the recesses 55 has a small detent 56. These recesses and detents cooperate with ears 57 and holes 58 in the ears of a bezel 59. The bezel is simply placed against the front surface of the housing 12 with the ears 57 extending into the recesses 55. The detents 56 pop into the holes 58 and thereby secure the bezel to the housing.

THE MOTHER BOARD

Referring to FIGS. 1, 2 and 4, the mother board 42 is secured to the housing 12 by male-female standoffs 61 at its corners. The front face of the mother board has four sets of vertical wire-wrap pins 62 each being connected to four integrated circuit sockets 63 mounted on the rear face of the mother board. The front face also has a centrally located socket 64 (FIG. 4) adapted to receive and make electrical connection with the printed circuit foil on the end of the light card 40. The light card socket 64 is located slightly to one side of a vertical center line of the mother board so as to receive the light card only when the light card is in the proper orientation, as will be explained in more detail below.

The mother board also has on its rear face a fourteen position socket 65 by which connection from the terminals on the mother board are made, by means of a flat cable 66 to fourteen positions on terminal board 45.

THE POWER SUPPLY

The power supply 44 is mounted on a board 70 having the power supply components 71 and printed circuit foil mounted on the rear face. The power supply is mounted on the mother board by attaching it to the male-female standoffs 61 which secure the mother board to the housing. The power supply 44 is electrically connected to the mother board by five pins 72 which are inserted in five aligned sockets 73, 74 on the mother board 42 and power supply board 70, respectively. Power from the terminal board 45 to the power supply is provided through two power connections 76 which are connected by screws 77 to the power supply board and by screws 78 to the terminal board.

THE TERMINAL BOARD

The terminal board has on its rear face two vertical sets of seven terminals 80 to which filed contacts are connected. Those terminals which are to be connected to the point cards within the housing are connected via printed circuitry to a plug 81 at the other end of flat cable 66 which is mounted on the terminal board 45 and soldered into position there. Two additional terminals 82 are connected via printed circuitry to terminals 83 which are connected to the power supply. Only one 24 volt connection need be made to any selected terminals 82 on one of the modules of the annunciator. All of the other power supply terminals to the remaining modules will be interconnected by the flat cable interconnections to be described below.

The terminal board 45 and power supply board 70 are physically mounted on the mother board 42 by means of the standoffs 79 and screws 84 passing through the corners of the boards 45 and 70 and threaded into the male-female standoffs 61 on the mother boards 42.

THE LIGHT CARD OR COMBINED LIGHT AND CONTROL CARD

The light card 40 carries a reflector 85 which is cup-shaped having a bottom wall and side walls. The plane of the light card intersects the reflector bottom wall on a line which is off center by the amount that the light card socket 64 on the mother board is offset from its center line. The reflector is riveted to the light card by two pairs of ears 86. The reflector carries six knockout positions 87 for light bulbs 93, the knockout positions being aligned with six sockets 88 which are secured to the light card and electrically connected to the printed circuit on the light card.

As a matter of convenience and economics, the light card has sligthly different wiring for the one point, two point, three point and four point systems. For example, in the one point system two diagonal sockets and bulbs will be connected in parallel. In the two point system, the upper and lower light bulb pairs will each be connected in parallel. In the three point system, the upper, middle and lower pairs of sockets and bulbs will be connected in parallel. In the four point system the middle sockets will be disconnected and the upper and lower sockets will be connected to individual circuits. The parallel pairs of sockets permit the use of two inexpensive light bulbs with greater reliability than using one light bulb at each reflector position on the light card. To increase further the life and reliability of the bulbs, the circuits are arranged to apply a continuous low voltage to the bulbs' filaments so that they are continuously kept warm, thereby avoiding the destructive effects of thermal shock which occur when the light bulbs are energized from a completely deenergized state.

The reflector is cup-shaped and has four forwardly extending side walls 90 which have ribs 91 positioned in selected locations to create one pair of opposed slots on the upper and lower side walls and three opposed slots in the vertical side walls to receive dividers 92. The orientation of the ribs is such that a single, centered horizontal divider creates a two point reflector, two horizontal dividers to divide the reflector into thirds for a three point reflector and a cross divider (as shown in FIG. 3) for dividing the reflector into four areas for a four point reflector.

When the light card is inserted in the proper orientation in the housing, the printed circuit card itself will properly make electrical connection to the socket connector 64 and the reflector will seat snugly within the opening in the front of the housing 12. On the other hand, if the light card is inverted, the offset positioning of the reflector will cause the reflector to interfere with the side wall of the housing before the reflector can be inserted into the housing. Thus, the installer will know that the orientation is not proper and will reverse it before any power is applied which would short out any of the circuit elements.

One light card for each annunciator will have mounted on it a complete printed circuit and logic components to form a control card. In this way, the combined light and control card does not occupy any additional space in the annunciator thereby making available additional capacity without any requirement of additional annunciator space.

THE POINT CARD

The point card 41 has printed circuit foil on one face and the circuit components mounted on the other face. Each point card is connected via the mother board and terminal board to a single monitoring sensor. It makes no difference whether the sensor contacts are normally open or normally closed, for the arrangement is such that by selectively positioning a jumper in the sockets provided therefor, the point card can be set for normally open or normally closed field contacts. Further, the point card is also designed to be programmable for any one of approximately twelve different sequences of operations as desired by the customer. One of the sequences, the K sequence, will be described below for illustrative purposes. The significant concept is, however, that by judicious selection of components and organization of the printed circuitry, a standard point card can be modified for use in any one of a number of different systems or sequences simply by the application of jumpers in the appropriate sockets.

At one end of the point card, a socket connector 94 is provided, the connector being adapted to engage and make electrical connection with the vertical line of pins 62 on the mother board 42. The socket connector is located at one side of the circuit of the point card so that it can only engage the line of pins 62 when the card is properly oriented and inserted in the desired slot 51 in the housing. If the card were inverted, the socket connector would not make contact with the terminal pins 62.

The point card controls the application of 24 volts to the light bulbs 93 on the light card. If there is a short in the bulbs or in the sockets, costly circuit components on the bulbs could be burned out. Therefore, it is preferred to energize the bulbs through an optically isolating circuit on the point card.

All of the point modules are interconnected by flat cables 95 having plugs which are inserted in the integrated circuit sockets at the rear face of the mother board. FIG. 5 shows the manner in which the flat cables 95 are applied to serially connect all of the modules. When all of the modules are thus interconnected, one control card as well as one power source supplies all of the point cards.

ALARM HORN

Optionally, the annunciator system may be provided with an alarm horn to provide an audible signal that a fault has occurred on one or more of the points. A special relay card 100 may be provided and mounted internally in one of the housings 12, or, alternatively, the relay may be mounted externally on a separate circuit outside of the main annunciator assembly. Internal mounting of the relay is preferred if the annunciator is in an environment wherein stray fields might accidentally trigger the relay circuit. An alarm horn 101 is operated by the relay circuit mounted on the panel outside of the annunciator assembly.

CONTROL CIRCUIT AND OPERATION

A control circuit is illustrated in FIG. 6 with controls for providing what is known in the art as a K sequence operation. As indicated above, the annunciator of the present invention is designed for many different sequences and preferably the points cards are provided with the logic and physical arrangement which permits the selection of one out of approximately twenty sequences simply by appropriate application of jumpers to the point card.

In the circuit of FIG. 6, elements previously described are shown in diagrammatic form. A 24 volt DC source, provided by the customer, is shown at 105 connected to the power supply. The power supply has a common terminal 106, a 12 volt terminal 107 and a 24 volt terminal 108. The 24 volt terminal is connected through the light bulbs 93 on their respective light cards 40 within each module 11. The control module, indicated at 109, is mounted on its respective light card which is contained within any one of the selected modules 11.

The sensors in the field operate normally open contacts 110 or normally closed contacts 111, each contact being connected to a respective point card on one side and being connected to the 24 volt supply on the other side.

A set of manually operable buttons for "test," "acknowledge," and "reset" are shown at 113. These buttons may be internal, that is, mounted on a separate module or, alternatively, they may be external being mounted on the panel 28 which supports the annunciator assembly.

Assuming there is a fault on point number one, the 24 volts applied to the point card associated with point number one will operate an isolation relay on the point card to activate the point card 41. The point card transmits a pulse to the control module 109 which in turn applies a signal from the control module 109 to the relay 100 causing the alarm 101 to sound. A flasher signal, constantly applied from the control card to all of the point modules, is connected to the lamp circuit controlled by point number two to cause the lamp 93 to flash constantly. Specifically, the flasher signal is connected to a light bulb driver transistor which causes the energization of the light bulb.

At this stage of the sequence, the audible horn signals the operator that a fault has occurred and, by viewing the panel, the operator can determine that the fault is at point number one.

The operator then can push the "acknowledge" button which applies signals to the control card and to the point card to stop the flashing of the light and to shut off the alarm horn. The light thus returns to a steady state.

After the fault is believed to be cleared, the operator may push a "reset" button which applies a signal to the control card to deenergize the light if the fault is cleared. Thus, the system is returned to its original condition.

At any time, the operator can push the "test" button which applies a signal, comparable to a fault signal, to all of the point cards. Thus, at any time the operator can make a 100% check to be sure that all point cards, light bulbs and the like are operating properly. Having made the test, the operator pushes the "reset" button to return the annunciator to its normal condition.

The sequence of operations for the annunciator, as described above, is known as are other sequences which can be provided for through modification of the circuitry. By proper design of the point card, as indicated above, these additional sequences can be provided utilizing a standard point card having variable jumper connections for creating the different sequences.

A thrust of the present invention, which can be perceived from the foregoing description, is that a wide variety of annunciators can be built up very simply from standard components and that these standard components are connected together without any need for hand wiring. Thus, the time and expense required for building an annunciator to a particular customer's specifications is very substantially reduced.

Further, if the number of modules for a customer's operation is selected with the view toward future expansion, that is, by providing an oversupply of module housings for the number of point cards involved in the initial set-up, expansion is very simply accommodated by the addition of standard point cards as described above. When point cards are added, the light card is normally replaced with one having the appropriate wiring of the sockets, a number of knockouts made and dividers placed in the reflector.

The substantial expansion of the number of points in the annunciator can be made without any need to modify the capacity of the power supply in view of the fact that each module has its own power supply.

Finally, the components have been designed for interconnection with one another in such a way as to minimize any possibility of short circuit arising out of improper connection of the elements with their connectors.

Having described my invention, I claim:

1. A module for a multi-module annunciator comprising,
   an elongated mother board mounted on the rear end of said housing and having on the front face thereof a multi-terminal connector for a light card and a plurality of multi-terminal connectors for point cards,
   a light card, means for slidably mounting said light card in said housing with connection to its connector, said light card having a plurality of light bulb receiving sockets,
   at least one point card, and means for slidably mounting a plurality of point cards in said housing with connection to its connector,
   a power supply mounted on a card having dimensions no greater than the cross-section of said housing,
   means mounting said card on the rear side of said mother board,
   means electrically connecting said power supply to said mother board,
   and a terminal board mounted to the rear of said power supply card and electrically connected to said multi-terminal connectors for said point cards,
   whereby as an annunciator is built up from modules, the total power supply is automatically sized to the size of the complete annunciator.

2. A module according to claim 1 in which said electrical connecting means comprises,
   a plurality of aligned sockets on said mother board and power supply card, respectively, and
   pins passing through said aligned sockets to connect said board to said power supply card.

3. A module according to claim 1 further comprising,
   said terminal board having connectors for a plurality of field contact inputs,
   said connectors being connected to a multi-terminal socket on said terminal board,
   and means including a plug for said multi-terminal socket electrically connecting said terminal board to the point card connectors on said mother board.

4. A module for an annunciator comprising,
   an elongated, hollow plastic housing of rectangular cross-section,
   a universal mother board mounted on the rear end of said housing and having on the front face thereof a multi-terminal connector for a light card and a plurality of multi-terminal connectors for point cards,
   said mother board having a rear face, said rear face having plural connectors adapted to receive plug-in connectors, said rear face connectors being connected to said multi-terminal connectors, whereby multiple modules may be interconnected in select arrays with plug-in connectors,
   a terminal board mounted to the rear of said mother board and having plural terminals to which conductors from field contacts are connected, means connecting said plural terminals to said mother board whereby field contacts are connected to said point card terminals via said terminal board and said mother board, a light card, means for slidably mounting said light card in said housing with connection to its connector, said light card having a plurality of light bulb receiving sockets, at least one point card, and means for slidably mounting a plurality of point cards in said housing with connection to its connector, whereby said module may easily be modified in the field to add additional point cards simply by inserting additional point cards into existing multi-terminal connectors.

5. An annunciator comprising, a plurality of modules as in claim 4 mounted adjacent one another, a plurality of sockets on the rear face of said mother board, and a flat cable having plugs on each end interconnecting the sockets of all adjacent modules.

6. A module as in claim 4 further comprising, a reflector mounted on one end of said light card and normally fitting snugly within said housing, said reflector being cup-shaped and having a generally planar bottom wall integral with four side walls, said light card being perpendicular to said bottom wall and intersecting said bottom wall slightly offset from the center line of said bottom wall, the connector for said light card being similarly slightly offset from the center line of said mother board thereby permitting said light card to be applied to said connector in only one orientation.

7. A module as in claim 4 further comprising, a reflector mounted on one end of said light card, said reflector being cup-shaped and having a generally planar bottom wall integral with four side walls, slots formed in said side walls, dividers cooperating with said slots for selectively dividing said reflector into any of one, two, three and four compartments, a light bulb array mounted on said light board and adapted to provide at least one light bulb for each compartment.

8. A module as in claim 4 further comprising, a plurality of longitudinal slots on the opposed interior surfaces of said housing, point cards mounted in said slots, a connector mounted on one side of each point card, the point card connector on said mother board being located to one side of a plane defined by opposing slots and in alignment with the connector on said point card.

9. An annunciator comprising, a plurality of modules mounted adjacent to one another, each module including, an elongated, hollow plastic housing of rectangular cross-section, a mother board mounted on the rear end of said housing and having on the front face thereof a multi-terminal connector for a light card and a plurality of multi-terminal connectors for point cards, said mother board having a rear face, said rear facing having plural connectors adapted to receive plug-in connectors, a light card, slidably mounted in said housing and connected to its connector, at least one point card slidably mounted in said housing and connected to one of its connectors, and a control circuit mounted on one of the light cards in said annunciator, and flat cables having plugs connected to said rear face connectors, said flat cables interconnecting all of said modules.

10. An annunciator according to claim 9 further comprising, a frame surrounding the front portion of said annunciator, said frame comprising, four extrusions of identical cross-section and sized to extend snugly around the assembly of modules, said extrusion having a slot opening at the rear of said frame, four corner members, each having a pair of keys projecting into the slots of respective extrusions to tie adjacent extrusions together, and set screws on said keys for securing said keys to said extrusions.

11. An annunciator as in claim 10 in which said set screws are inclined with respect to said keys so that tightening said set screws pushes each extrusion tightly against a corner member.

12. An annunciator as in claim 10 further comprising, a second slot in said extrusion, a plurality of J clips each having a leg hooked in said slot and a screw in said J clip for securing said J clip frame and annunciator to a panel surrounding said annunciator.

13. An annunciator as in claim 9 in which said housing has, square pegs and mating square holes in respective opposed surfaces, and round pins and mating round holes in the remaining respective opposed surfaces, the pins and pegs of adjoining housings fitting into their mating holes to properly orient all housings in the annunciator.

14. An annunciator as in claim 9 further comprising, a mother board, a power supply and a terminal board mounted on and projecting from the rear end of each module, a shroud around the perimeter of the rear end of said annunciator, said shroud consisting of L-shaped foraminous corner-forming elements and a plurality of identical, substantially flat foraminous elements interconnecting said corner-forming elements.

* * * * *